(12) United States Patent
Hoshi et al.

(10) Patent No.: US 7,173,433 B2
(45) Date of Patent: Feb. 6, 2007

(54) CIRCUIT PROPERTY MEASUREMENT METHOD

(75) Inventors: Hiroyuki Hoshi, Tokyo (JP); Hitoshi Kurusu, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/055,698

(22) Filed: Feb. 11, 2005

(65) Prior Publication Data
US 2005/0258819 A1 Nov. 24, 2005

(30) Foreign Application Priority Data
May 18, 2004 (JP) ............... 2004-148309

(51) Int. Cl.
*G01R 35/00* (2006.01)
(52) U.S. Cl. .............. 324/601; 324/754; 324/95; 324/158.1
(58) Field of Classification Search ........ 324/754–762, 324/95, 601
See application file for complete search history.

(56) References Cited

U.S. PATENT DOCUMENTS 5,194,932 A * 3/1993 Kurisu ............... 257/773
5,594,358 A * 1/1997 Ishikawa et al. ........... 324/762
6,555,907 B2 * 4/2003 Katoh ..................... 257/728

FOREIGN PATENT DOCUMENTS

| JP | 5-152395 | 6/1993 |
| JP | 10-285023 | 10/1998 |
| JP | 2000-101309 | 4/2000 |
| KR | 2003-4474 | 1/2003 |

OTHER PUBLICATIONS

Carlton, D.E. et al.; "Microwave Wafer Probing Achieves On-Wafer Measurements Through 18 GHz", Reprinted from the May 1985 edition of *MSN & Communications Technology*.

* cited by examiner

*Primary Examiner*—Jermele Hollington
*Assistant Examiner*—Arleen M. Vazquez
(74) *Attorney, Agent, or Firm*—Leydig, Voit & Mayer, Ltd.

(57) ABSTRACT

In a high frequency circuit property measurement method, prior to property measurements of a high frequency circuit with RF measurement probe heads, RF measurement probe heads are calibrated using a calibration pattern comprising a signal line having a characteristic impedance and extending on a dielectric substrate, a first GND pad having one end disposed close to and at an interval from a first end of the signal line, a second GND pad having one end disposed close to and at an interval from a second end of the signal line, and a conductor electrically coupling the first GND pad to the second GND pad.

1 Claim, 11 Drawing Sheets

CIRCUIT PROPERTY MEASUREMENT METHOD

BACKGROUND OF THE INVENTION

1. Field of the Invention

The present invention relates to an RF measurement method for a high frequency circuit, a calibration pattern, and a calibration jig and, in particular, relates to an RF measurement method for a high frequency circuit for use in a communication device adapted for a microwave band or a millimeter wave band that is used in mobile communication, optical communication, satellite communication, and the like, and further to a calibration pattern and a calibration jig.

2. Description of the Related Art

In recent years, communication devices used in microwave bands or millimeter wave bands have been more and more miniaturized. Following it, high frequency circuit devices are also required to be further miniaturized, and accordingly, high frequency circuits used in those high frequency circuit devices are required to have proper qualities. In order to accurately evaluate the quality of the high frequency circuit, it is necessary to carry out RF measurement of the high frequency circuit by the use of a highly accurate measurement method, and therefore, there has been an increasing demand for a precise calibration method for setting a standard of the RF measurement.

The RF measurement of the high frequency circuit is performed on-wafer. This on-wafer RF measurement normally uses two RF measurement probe heads, each having a signal terminal and a GND terminal, in such a manner as to confront each other. Therefore, an RF measurement probe head calibration pattern is required to have a calibration pattern that corresponds to the RF measurement probe heads to be used.

Generally, there are available three kinds of probe heads as RF measurement probe heads. The first one is of a type having three contacts including one signal terminal and GND terminals located on both sides of the signal terminal, respectively. This first one is called, for example, a GSG-type RF measurement probe head.

The second one is of a type having two contacts including one signal terminal and one GND terminal wherein, as seeing the contacts from the side of a body of the RF measurement probe head, the signal terminal is arranged on the left side while the GND terminal is arranged on the right side. This second one is called, for example, an SG-type RF measurement probe head.

The third one is of a type also having two contacts wherein, however, the signal terminal and the GND terminal in the second SG-type RF measurement probe head are interchanged in position, and therefore, as seeing the contacts from the side of a body of the RF measurement probe head, the GND terminal is arranged on the left side while the signal terminal is arranged on the right side. This third one is called, for example, a GS-type RF measurement probe head.

For the RF measurement of the high frequency circuit, two measurement probe heads are used in such a manner as to confront each other. Accordingly, a calibration pattern is required which corresponds to such two measurement probe heads.

As a configuration pattern when using the two first GSG-type RF measurement probe heads in the confronting manner, it is possible to calibrate the two GSG-type RF measurement probe heads by the use of a calibration pattern having one signal line with a predetermined characteristic impedance and two GND lines disposed along the signal line on both sides thereof, respectively.

On the other hand, when the second SG-type RF measurement probe head and the third GS-type RF measurement probe head are used in the confronting manner, the signal terminals confront each other and the GND terminals confront each other so that, by the use of a calibration pattern having one signal line with a predetermined characteristic impedance and two GND lines disposed along the signal line on one side thereof, the signal terminals can be brought into contact with the same signal line and simultaneously the GND terminals can be brought into contact with the same GND lines, and therefore, it is possible to calibrate the two RF measurement probe heads.

However, when the two second SG-type RF measurement probe heads or the two third GS-type RF measurement probe heads are used in the confronting manner, assuming that the signal terminals of the two RF measurement probe heads are brought into contact with a signal line of a calibration pattern, the GND terminals thereof are located on both sides of the signal line, respectively, so that it is necessary to provide GND lines on both sides of the signal line, respectively.

On the other hand, if use is simply made of the calibration pattern that is used for calibrating the first GSG-type RF measurement probe heads, i.e. the calibration pattern having the two GND lines disposed along the signal line on both sides thereof, because the GND lines are separated from each other, the calibration cannot be implemented. Then, in view of this, if use is made of, for example, a calibration pattern in which the two GND lines are connected together at each one end thereof to surround the signal line or a calibration pattern in which the two GND lines are connected together at both ends of each of them to fully surround the signal line, the signal terminal of at least one of the RF measurement probe heads is disposed so as to lie across the GND line of the calibration pattern when performing the calibration.

As a known technique, there is a disclosure that, in order to suppress parasitic inductance in property examination of a semiconductor integrated circuit device to enable a high-frequency property examination, a pair of an input signal electrode and an output signal electrode and a pair of an input GND electrode and an output GND electrode are disposed on the surface of an IC chip, and these input GND electrode and output GND electrode are electrically connected to a backside electrode, provided on the back side of the IC chip, via conductors provided in through holes formed through the IC chip in a thickness direction thereof, respectively, so as to be electrically connected to each other via the backside electrode, thereby achieving common grounding (e.g. see JP-A-H05-152395, paragraphs [0005] to [0006] and FIGS. 1 and 2).

As another known technique, there is a disclosure that, in a square open-stub structure in a high frequency circuit for microwaves or millimeter waves, the voltage amplitude becomes zero at a position of λ/4 from an open-stub open end so that grounding is formed in a high-frequency manner (e.g. see JP-A-2000-101309, paragraph [0006] and FIG. 5).

When, as described above, the signal terminal of the RF measurement probe head is disposed so as to lie across the GND line of the calibration pattern, an RF signal affects a measurement value so that the measurement value is largely biased following an increase in signal frequency. For example, observing an input-side reflection property when measurement is performed for a through pattern having a characteristic impedance of 50Ω, the impedance is largely biased from 50Ω following an increase in frequency.

Conventionally, use has been made of a high frequency circuit of which the RF measurement can be performed by the use of different kinds of the measurement probe heads, for example, by the use of the SG-type RF measurement probe head and the GS-type RF measurement probe head. However, in order to achieve miniaturization and higher functions, demanded in recent years, of high frequency circuits, it becomes necessary to increase the degree of freedom in circuit arrangement. Consequently, there arises a case where the RF measurement cannot be carried out with the circuit property measurement using the measurement probe heads of the kinds in which the contacts are arranged differently, and it becomes necessary to implement the RF measurement by the use of the second SG-type RF measurement probe heads or the third GS-type RF measurement probe heads.

Accordingly, there arises a new problem that when use is made of the second SG-type RF measurement probe heads or the third GS-type RF measurement probe heads as described above, accurate calibration of the RF measurement probe heads cannot be implemented by the use of the conventional calibration pattern.

SUMMARY OF THE INVENTION

The present invention has been made for solving the foregoing problem and has a first object to provide a property measurement method for a high frequency circuit that can prevent an RF signal from affecting a measurement value in measurement of the RF signal, a second object to provide a calibration pattern that can prevent an RF signal from affecting a measurement value in measurement of the RF signal, and a third object to provide a calibration jig which makes it possible to easily exchange a calibration pattern that can prevent an RF signal from affecting a measurement value in measurement of the RF signal.

According to one aspect of the invention, there is provided a high frequency circuit property measurement method comprising: preparing a calibration pattern comprising a substrate, a signal line having one characteristic impedance and extending to have a first and a second end portion on said substrate, a first constant potential line having one end portion disposed close to and with a predetermined interval from said first end portion of the signal line, a second constant potential line having one end portion disposed close to and with a predetermined interval from said second end portion of the signal line, and a conductor for connecting between said first constant potential line and said second constant potential line electrically or in a high-frequency manner; and performing calibration prior to measurement of a to-be-measured circuit by using a first and a second property measurement probe head having the same arrangement of a signal terminal and a constant potential terminal, by bringing the signal terminal and the constant potential terminal of said first property measurement probe head into contact with said first end portion of the signal line and said one end portion of the first constant potential line of said calibration pattern, respectively, and by bringing the signal terminal and the constant potential terminal of said second property measurement probe head into contact with said second end portion of the signal line and said one end portion of the second constant potential line of said calibration pattern, respectively.

Accordingly, in a high frequency circuit property measurement method according to the present invention, neither of the signal terminals of the first and second property measurement probe heads is disposed so as to lie across the constant potential line of the calibration pattern.

Therefore, since an RF signal does not affect either of the signal terminals of the first and second property measurement probe heads, accurate calibration can be achieved so that the property measurement of the high frequency circuit is precisely carried out. Consequently, selection of high frequency circuits can be accurately performed to thereby improve the yield of high frequency circuit devices.

According to another aspect of the invention, there is provided a calibration pattern comprising: a substrate; a signal line having one characteristic impedance and extending to have a first and a second end portion on said substrate; a first constant potential line having one end portion disposed close to and with a predetermined interval from said first end portion of the signal line; a second constant potential line having one end portion disposed close to and with a predetermined interval from said second end portion of the signal line; and a conductor for connecting between said first constant potential line and said second constant potential line electrically or in a high-frequency manner.

Accordingly, a calibration pattern according to the present invention is advantageous in a high frequency circuit property measurement as either of the signal terminals of the RF measurement probe heads does not lie across the GND line even when the SG-type RF measurement probe heads or the GS-type RF measurement probe heads are used so as to confront each other with their signal terminals being brought into contact with the signal line of the calibration pattern.

Therefore, the RF signal does not affect the measurement value so that there is no occurrence of the measurement value being largely biased following an increase in signal frequency. Consequently, it is possible to implement the calibration of the RF measurement probe heads with high accuracy.

According to still another aspect of the invention, there is provided a calibration jig comprising: a calibration pattern comprising, a substrate, a signal line having one characteristic impedance and extending to have a first and a second end portion on said substrate, a first constant potential line having one end portion disposed close to and with a predetermined interval from said first end portion of the signal line, a second constant potential line having one end portion disposed close to and with a predetermined interval from said second end portion of the signal line, and a conductor for connecting between said first constant potential line and said second constant potential line electrically or in a high-frequency manner; and a dielectric substrate having a recessed portion formed on the surface thereof for exchangeably mounting therein the calibration pattern.

Accordingly, a calibration jig according to the present invention is advantageous in a high frequency circuit property measurement as the calibration jig makes it possible to carry out calibration at predetermined required frequencies by the use of one jig.

Consequently, selection of high frequency circuits can be accurately and easily performed to thereby improve the yield of high frequency circuit devices with the simple process.

Other objects and advantages of the invention will become apparent from the detailed description given hereinafter. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

In all figures, the substantially same elements are given the same reference numbers.

DESCRIPTION OF THE PREFERRED EMBODIMENTS

Embodiment 1

Figure 1:
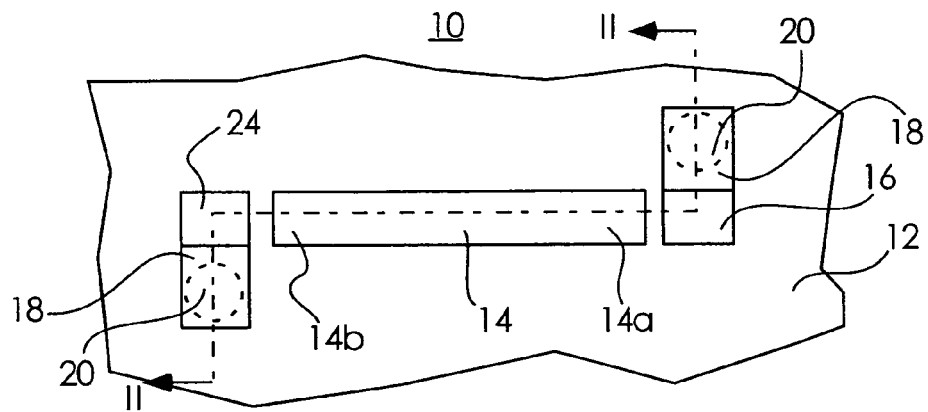
FIG. 1 is a plan view of an RF measurement calibration pattern according to one embodiment of the present invention.
Figure 2:
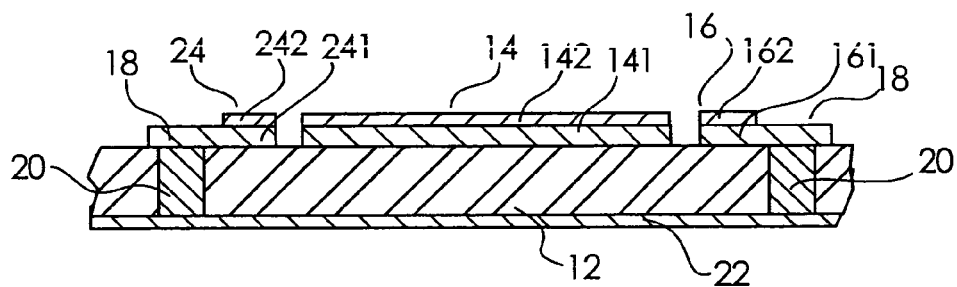
FIG. 2 is a sectional view of the RF measurement calibration pattern taken along a line II—II in FIG. 1.

FIG. 1 is a plan view of an RF measurement calibration pattern according to one embodiment of the present invention. FIG. 2 is a sectional view of the RF measurement calibration pattern taken along a line II—II in FIG. 1. In the drawings to be referred, the same symbols represent the same or corresponding components, respectively.

In FIGS. 1 and 2, there is shown an RF measurement calibration pattern 10 being one example of Embodiment 1.

The RF measurement calibration pattern 10 comprises a dielectric substrate 12 serving as a substrate. A signal line 14 having a specific characteristic impedance of, for example, 50Ω is disposed on the surface of the dielectric substrate 12. The signal line 14 has a linear shape with both opposite ends and comprises a metal layer 141 and a gold-plating layer 142 disposed on the surface of the metal layer 141. Those both opposite ends of the signal line 14 will be referred to as, for example, a first end portion 14a and a second end portion 14b, respectively.

A first GND pad 16 serving as a first constant potential line is disposed with a predetermined interval defined between itself and the first end portion 14a of the signal line 14. The first GND pad 16 has a front end portion located on a prolongation of the signal line 14 in its longitudinal direction and is electrically separated from the signal line 14. The other end portion of the first GND pad 16 is connected to a through-hole electrode 18.

The first GND pad 16 is connected to a backside metal layer 22, disposed on the back side of the dielectric substrate 12, via the through-hole electrode 18 and a via hole 20 formed by burying a conductor in a through hole formed through the dielectric substrate 12 in its thickness direction. The first GND pad 16 comprises a metal layer 161 and a gold-plating layer 162 disposed on the surface of the metal layer 161. In this embodiment, the through-hole electrode 18 connected to the first GND pad 16 is formed by the metal layer 161 part of which also forms the first GND pad 16.

Further, a second GND pad 24 serving as a second constant potential line is disposed with the predetermined interval defined between itself and the second end portion 14b of the signal line 14. The second GND pad 24 has a front end portion located on a prolongation of the signal line 14 in its longitudinal direction and is electrically separated from the signal line 14. The other end portion of the second GND pad 24 is connected to a through-hole electrode 18.

The second GND pad 24 is connected to the backside metal layer 22, disposed on the back side of the dielectric substrate 12, via the through-hole electrode 18 and a via hole 20 formed by burying a conductor in a through hole formed through the dielectric substrate 12 in its thickness direction. The second GND pad 24 comprises a metal layer 241 and a gold-plating layer 242 disposed on the surface of the metal layer 241. In this embodiment, the through-hole electrode 18 connected to the second GND pad 24 is formed by the metal layer 241 part of which also forms the second GND pad 24.

Accordingly, the first GND pad 16 and the second GND pad 24 are electrically connected together via the conductors, i.e. the through-hole electrodes 18, the via holes 20, and the backside metal layer 22. In this embodiment, the first GND pad 16 and the second GND pad 24 are grounded, but may not necessarily be grounded if electrically conducted via the through-hole electrodes 18, the via holes 20, and the backside metal layer 22.

Figure 3:
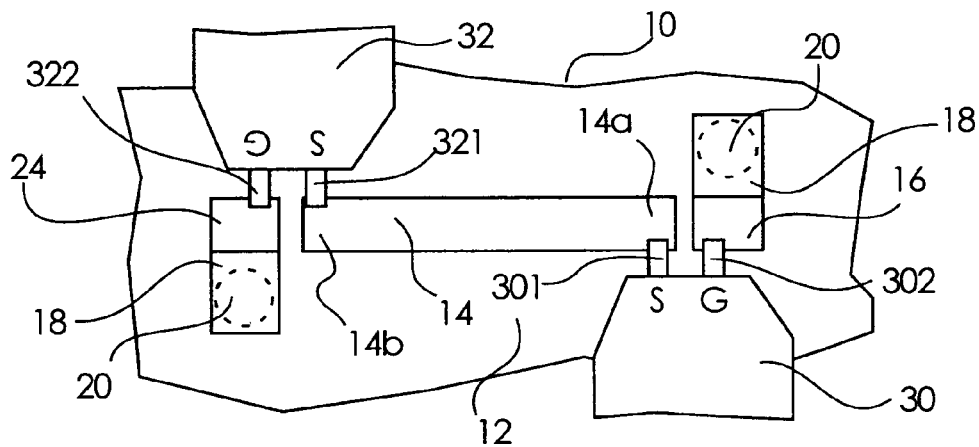
FIG. 3 is an exemplary diagram showing the state where RF measurement probe heads are in contact with the RF measurement calibration pattern according to Embodiment 1 of the present invention.

FIG. 3 is an exemplary diagram showing the state where RF measurement probe heads are in contact with the RF measurement calibration pattern according to Embodiment 1 of the present invention.

In FIG. 3, an RF measurement probe head 30 and an RF measurement probe head 32 are disposed so as to confront each other like in an ordinary measurement state. In the description of this embodiment, the two RF measurement probe heads 30 and 32 are both, for example, SG-type RF measurement probe heads.

In calibration, a signal terminal 301 (indicated as S in FIG. 3) of the RF measurement probe head 30 is in contact with the signal line 14 while a GND terminal 302 (indicated as G in FIG. 3) thereof is in contact with the first GND pad 16. Further, a signal terminal 321 (indicated as S in FIG. 3) of the RF measurement probe head 32 is in contact with the signal line 14 while a GND terminal 322 (indicated as G in FIG. 3) thereof is in contact with the second GND pad 24.

When the calibration is carried out using the RF measurement calibration pattern 10, either of the signal terminal 301 and the signal terminal 321 does not lie across the GND line. Therefore, an RF signal does not affect a measurement value so that there is no occurrence of the measurement value being largely biased following an increase in signal frequency. Consequently, it is possible to implement the calibration of the RF measurement probe head 30 and the RF measurement probe head 32 with high accuracy.

Now, description will be given about a calibration method for the RF measurement probe heads.

Figure 4:
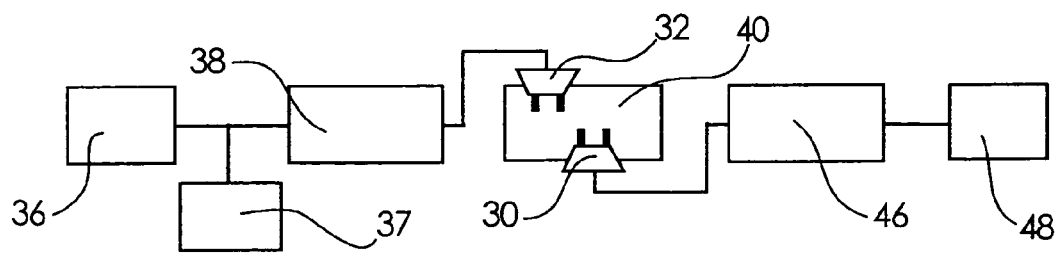
FIG. 4 is a block diagram for explaining a measurement system for a high frequency circuit according to the present invention.
Figure 5:
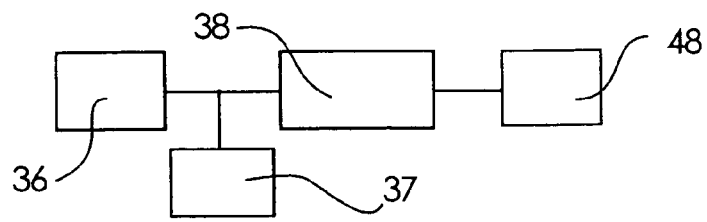
FIGS. 5 and 6 are block diagrams for explaining a method of performing zero correction of the measurement system for the high frequency circuit according to the present invention.
Figure 6:
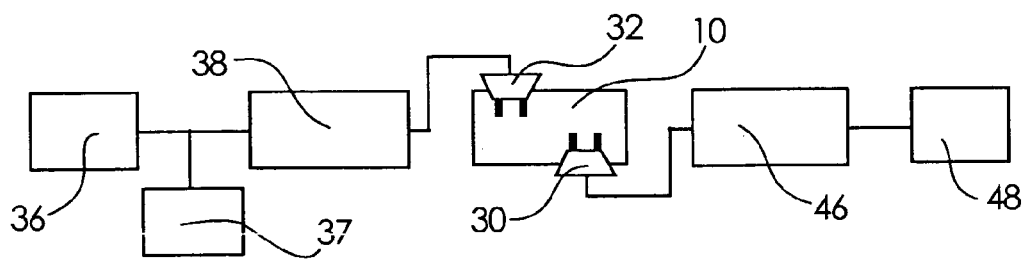

FIG. 4 is a block diagram for explaining a measurement system for a high frequency circuit according to the present invention. FIGS. 5 and 6 are block diagrams for explaining a method of performing zero correction of the measurement system for the high frequency circuit according to the present invention. This zero correction method is carried out when, for example, performing noise measurement or input/output measurement of the high frequency circuit.

As shown in FIG. 4, the measurement system for the high frequency circuit is as follows.

A signal from a signal source 36 is input into a to-be-measured circuit 40 via an input circuit 38. The signal input is measured by a first power meter 37 disposed between the signal source 36 and the input circuit 38. The signal input into the to-be-measured circuit 40 is performed via an SG-type RF measurement probe head 32 like that shown in FIG. 3.

An output from the to-be-measured-circuit 40 is delivered to an output circuit 46 via, for example, an SG-type RF measurement probe head 30 like that shown in FIG. 3 and the signal output is measured by a second power meter 48.

Description will be given about the zero correction method for the high frequency circuit measurement system shown in FIG. 4.

(1) First, in FIG. 5, the signal source 36 and the input circuit 38 are connected together via the first power meter 37 and further the second power meter 48 is connected to an RF input-side end surface of the to-be-measured circuit 40. In this state, a correction value is input into the first power meter 37 so that the power at the RF input-side end surface of the to-be-measured circuit 40 coincides with the output power at an end surface of the signal source 36.

This correction value corresponds to a passing loss of the input-side circuit of the measurement system and, by carrying out this correction, a power value, obtained at the first power meter 37, of an output portion of the signal source 36 and the power at the RF input-side end surface of the to-be-measured circuit 40 become equal to each other.

(2) Then, as shown in FIG. 6, the RF measurement calibration pattern 10 is introduced in place of the to-be-measured circuit 40 in the high frequency circuit measurement system shown in FIG. 4 and correction is carried out for a passing loss of the output-side circuit of the measurement system.

Specifically, in the measurement system shown in FIG. 6, the signal terminal 321 and the GND terminal 322 of the SG-type RF measurement probe head 32 serving as the RF input-side end surface of the to-be-measured circuit 40 are brought into contact with the signal line 14 and the second GND pad 24 of the RF measurement calibration pattern 10, respectively, while the signal terminal 301 and the GND terminal 302 of the output-side RF measurement probe head 30 are brought into contact with the signal line 14 and the first GND pad 16 of the RF measurement calibration pattern 10, respectively. This contact state is the same as that shown in FIG. 3.

In this state, a correction value is input into the second power meter 48 so that a value obtained at the second power meter 48 coincides with a value obtained at the first power meter 37. This correction value corresponds to a passing loss of the output-side circuit of the measurement system.

After implementing the correction for the passing loss of the input-side circuit and the passing loss of the output-side circuit as described above, noise measurement and input/output measurement of the to-be-measured circuit are carried out.

Since the calibration is carried out using the RF measurement calibration pattern 10, either of the signal terminal 301 and the signal terminal 321 does not lie across the GND line during the calibration. Therefore, an RF signal does not affect the measurement value so that there is no occurrence of the measurement value being largely biased following an increase in signal frequency. Consequently, it is possible to implement the calibration of the RF measurement probe head 30 and the RF measurement probe head 32 with high accuracy.

Now, description will be given about a calibration method when performing S-parameter measurement, as one example of calibration.

Figure 7:
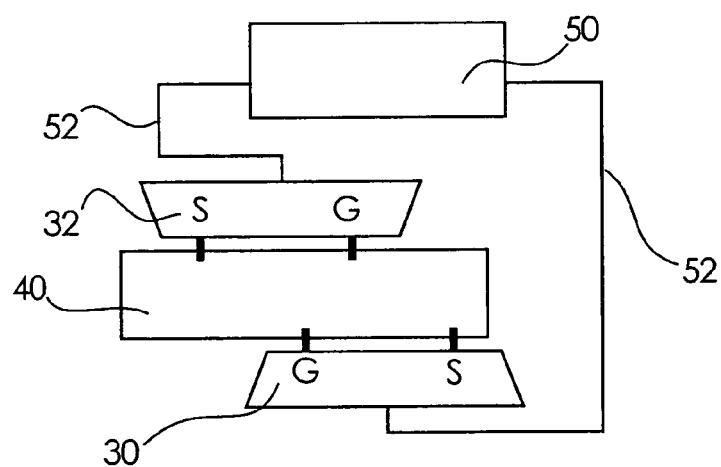
FIG. 7 is an exemplary diagram showing a measurement system when performing S-parameter measurement of a high frequency circuit, according to the present invention.

FIG. 7 is an exemplary diagram showing a measurement system when performing S-parameter measurement of a high frequency circuit, according to the present invention. FIGS. 8, 9, 10, and 11 are exemplary diagrams showing the calibration method when carrying out the S-parameter measurement of the high frequency circuit, according to the present invention. Herein, as one example, description will be given about a case where a SOLT method is used.

In FIG. 7, an RF measurement probe head 30 and an RF measurement probe head 32 are connected to a network analyzer (NWA) 50 via, for example, coaxial cables 52, respectively. By bringing the RF measurement probe head 30 and the RF measurement probe head 32 into contact with a high frequency circuit, i.e. a to-be-measured circuit 40, the S-parameter measurement is carried out. In this event, it is necessary to derive a correction value for the coaxial cable 52 and the RF measurement probe head 30 and a correction value for the coaxial cable 52 and the RF measurement probe head 32.

Next, description will be given about the calibration method when implementing the S-parameter measurement.

Figure 8:
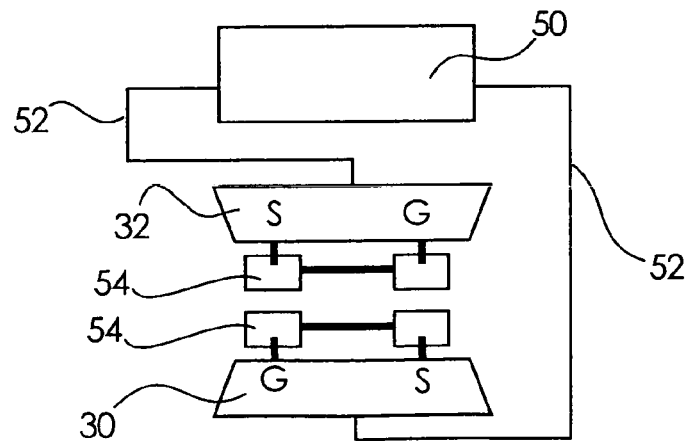
FIGS. 8, 9, 10, and 11 are exemplary diagrams showing the calibration method when carrying out the S-parameter measurement of the high frequency circuit, according to the present invention.

(1) Referring to FIG. 8, the RF measurement probe head 30 and the RF measurement probe head 32 are each connected to a resistance pattern 54 having a circuit characteristic impedance of, for example, 50Ω to thereby carry out measurement for calibration of the network analyzer 50.

Figure 9:
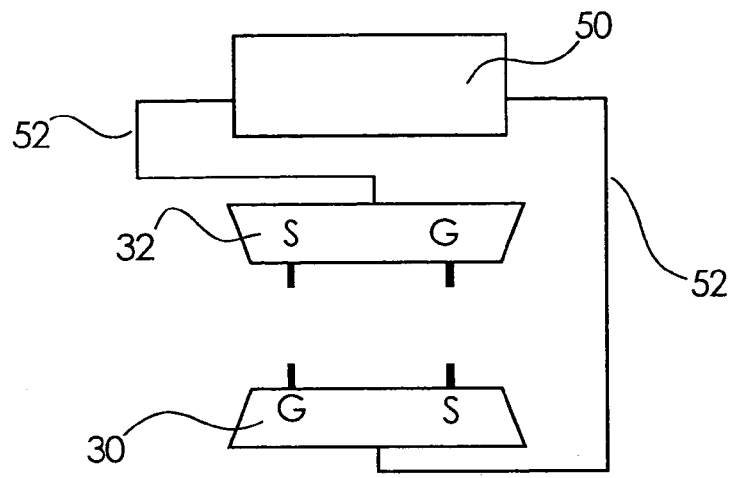

(2) Referring to FIG. 9, the RF measurement probe head 30 and the RF measurement probe head 32 are each put in an open state to thereby carry out measurement for the calibration of the network analyzer 50.

Figure 10:
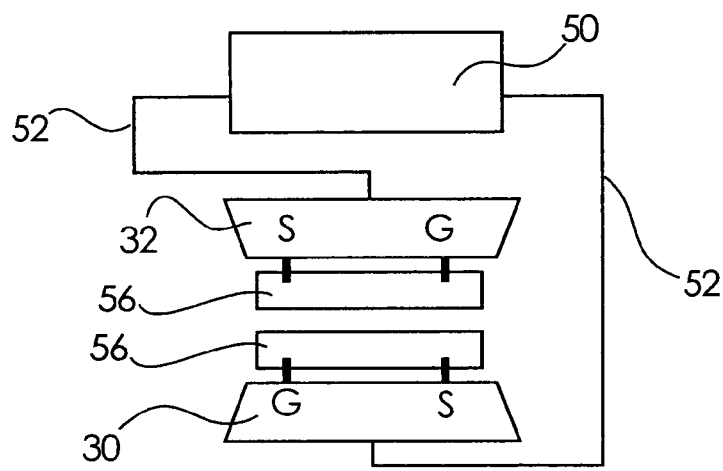

(3) Referring to FIG. 10, the RF measurement probe head 30 and the RF measurement probe head 32 are each connected to a short pattern 56 to thereby carry out measurement for the calibration of the network analyzer 50.

Figure 11:
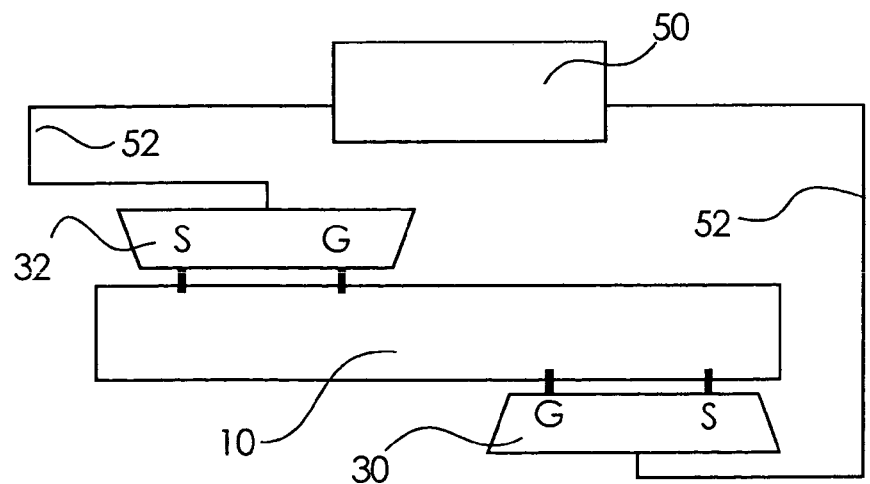

(4) Referring to FIG. 11, the RF measurement probe head 30 and the RF measurement probe head 32 are connected to the RF measurement calibration pattern 10 to thereby carry out measurement for the calibration of the network analyzer 50.

Specifically, the signal terminal 321 and the GND terminal 322 of the RF measurement probe head 32 are brought into contact with the signal line 14 and the second GND pad 24 of the RF measurement calibration pattern 10, respectively, while the signal terminal 301 and the GND terminal 302 of the RF measurement probe head 30 are brought into contact with the signal line 14 and the first GND pad 16 of the RF measurement calibration pattern 10, respectively. This contact state is the same as that shown in FIG. 3. In this state, the measurement is carried out for the calibration of the network analyzer 50.

In this event, the characteristic impedance of the RF measurement calibration pattern 10 should be equal to that of the resistance pattern 54.

Using results of the measurements (1) to (4), calculation is carried out for correcting respective S parameters.

Thereafter, the S-parameter measurement of the to-be-measured circuit 40 is implemented using the coaxial cable 52 and the RF measurement probe head 30 in the calibrated state and the coaxial cable 52 and the RF measurement probe head 32 in the calibrated state.

Also in this calibration, since the calibration is carried out using the RF measurement calibration pattern 10, either of the signal terminal 301 and the signal terminal 321 does not lie across the GND line. Therefore, an RF signal does not affect the measurement value so that there is no occurrence of the measurement value being largely biased following an increase in signal frequency. Consequently, it is possible to implement the calibration of the RF measurement probe head 30, the RF measurement probe head 32, and the coaxial cables 52 with high accuracy.

Modification 1

Figure 12:
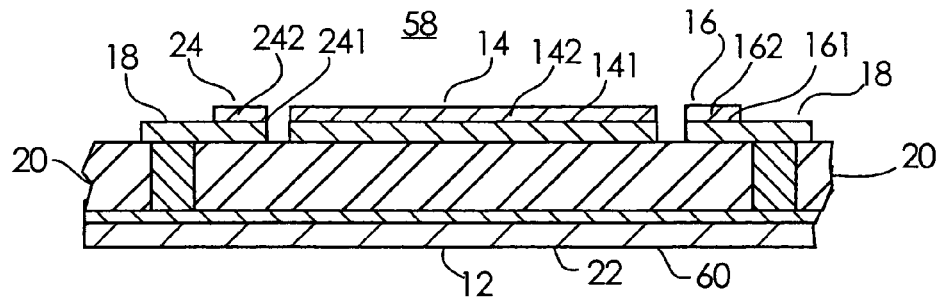
FIG. 12 is a sectional view of an RF measurement calibration pattern according to one embodiment of the present invention.

FIG. 12 is a sectional view of an RF measurement calibration pattern according to one embodiment of the present invention.

A plan view of the RF measurement calibration pattern 58 shown in FIG. 12 is the same as FIG. 1 being the plan view of the RF measurement calibration pattern 10 of Embodiment 1. Further, the RF measurement calibration pattern 58 shown in FIG. 12 is sectioned along a line corresponding to the line II—II in FIG. 1.

The RF measurement calibration pattern 58 is formed by further disposing a dielectric layer 60 so as to cover the backside metal layer 22 of the RF measurement calibration pattern 10.

When performing measurement using the RF measurement probe head 30 and the RF measurement probe head 32 that are disposed in such a manner as to confront each other, if calibration is carried out using the RF measurement calibration pattern 58, either of the signal terminal 301 and the signal terminal 321 does not lie across the GND line like in case of the RF measurement calibration pattern 10. Therefore, an RF signal does not affect the measurement value so that there is no occurrence of the measurement value being largely biased following an increase in signal frequency. Consequently, it is possible to implement the calibration of the RF measurement probe head 30 and the RF measurement probe head 32 with high accuracy. Further, even when the backside metal layer 22 is set to a constant potential, for example, a ground potential, since the backside metal layer 22 is covered with the dielectric layer 60, it is possible to stably carry out the calibration of the RF measurement probe head 30 and the RF measurement probe head 32 regardless of the state of a place where the RF measurement calibration pattern 58 is disposed.

Modification 2

Figure 13:
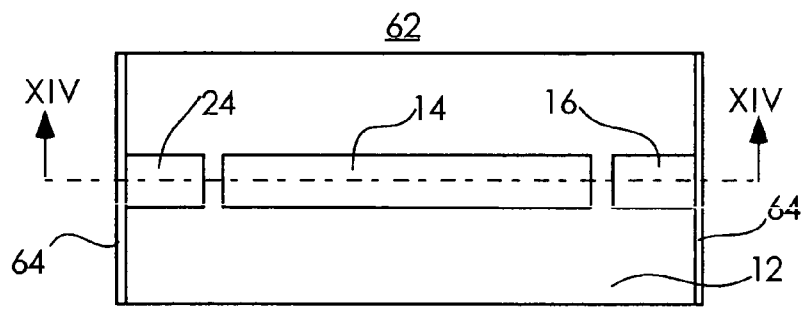
FIG. 13 is a plan view of an RF measurement calibration pattern according to one embodiment of the present invention.
Figure 14:
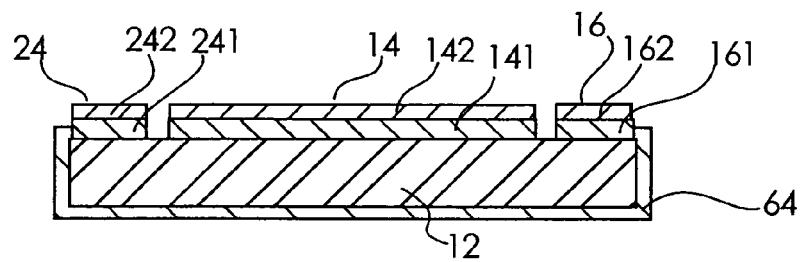
FIG. 14 is a sectional view of the RF measurement calibration pattern taken along a line XIV—XIV in FIG. 13.

FIG. 13 is a plan view of an RF measurement calibration pattern according to one embodiment of the present invention. FIG. 14 is a sectional view of the RF measurement calibration pattern taken along a line XIV—XIV in FIG. 13.

In the RF measurement calibration pattern 62 shown in FIGS. 13 and 14, a backside metal layer 64 extends to the surface of a dielectric substrate 12 via side surfaces thereof so as to be electrically connected to end portions, each on the side remote from or not adjacent to a signal line 14, of a first GND pad 16 and a second GND pad 24, respectively. Therefore, the through-hole electrodes 18 and the via holes 20, which are provided in Embodiment 1, are not provided.

That is, the end portions, each on the side not adjacent to the signal line 14, of the first GND pad 16 and the second GND pad 24 are directly connected to each other so as to be electrically conducted.

In the RF measurement calibration pattern 62 thus structured, in addition to the effect of the RF measurement calibration pattern 10, it is possible to increase areas of portions of the backside metal layer 64 disposed on the side surfaces of the dielectric substrate 12, and therefore, it is possible to reduce parasitic inductance components that are generated when the first GND pad 16 and the second GND pad 24 are commonly grounded.

Modification 3

Figure 15:
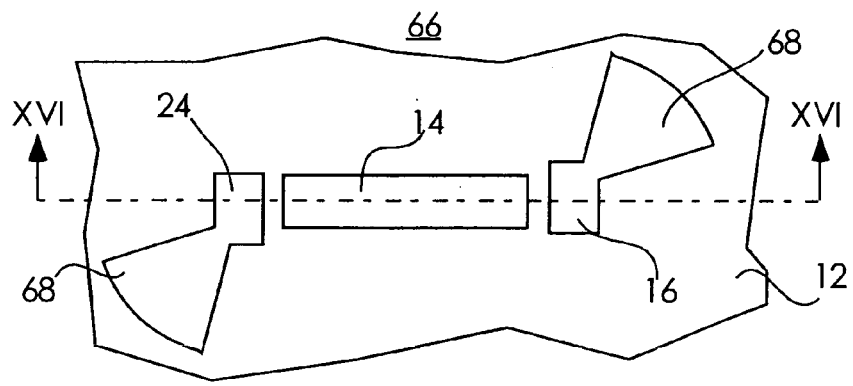
FIG. 15 is a plan view of an RF measurement calibration pattern according to one embodiment of the present invention.
Figure 16:
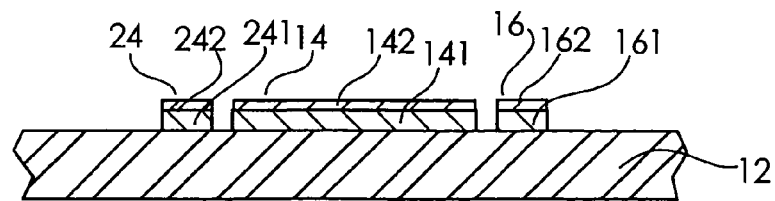
FIG. 16 is a sectional view of the RF measurement calibration pattern taken along a line XVI—XVI in FIG. 15.

FIG. 15 is a plan view of an RF measurement calibration pattern according to one embodiment of the present invention. FIG. 16 is a sectional view of the RF measurement calibration pattern taken along a line XVI—XVI in FIG. 15.

In the RF measurement calibration pattern 66 shown in FIGS. 15 and 16, open stubs 68 serving as conductors are connected to end portions, each on the side not adjacent to a signal line 14, of a first GND pad 16 and a second GND pad 24, respectively.

By setting a size of the open stub 68 to a quarter of a wavelength of frequency of a signal to be measured, the first GND pad 16 and the second GND pad 24 are connected together via the open stubs 68 in a high-frequency manner. Therefore, in the RF measurement calibration pattern 66, in addition to the effect of the RF measurement calibration pattern 10 of Embodiment 1, the via holes 20 and the backside metal layer 22 in the RF measurement calibration pattern 10 or the backside metal layer 64 extending to the surface of the dielectric substrate 12 via the side surfaces thereof in the RF measurement calibration pattern 62 of Modification 2 becomes unnecessary so that the production of the RF measurement calibration pattern is facilitated.

Modification 4

Figure 17:
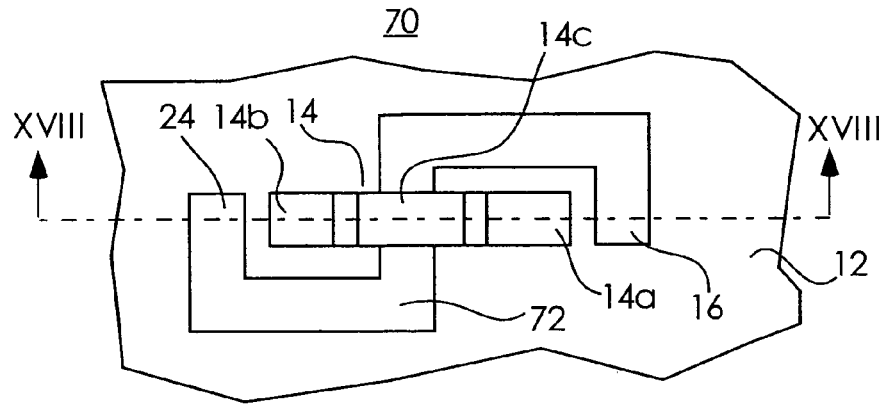
FIG. 17 is a plan view of an RF measurement calibration pattern according to one embodiment of the present invention.
Figure 18:
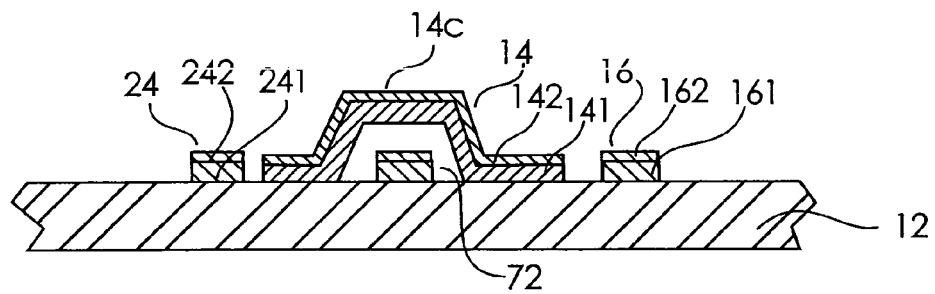
FIG. 18 is a sectional view of the RF measurement calibration pattern taken along a line XVIII—XVIII in FIG. 17.

FIG. 17 is a plan view of an RF measurement calibration pattern according to one embodiment of the present invention. FIG. 18 is a sectional view of the RF measurement calibration pattern taken along a line XVIII—XVIII in FIG. 17.

In the RF measurement calibration pattern 70 shown in FIGS. 17 and 18,-end portions, each on the side not adjacent to a first end portion 14a or a second end portion 14b of a signal line 14, of a first GND pad 16 and a second GND pad 24 are connected together via an extended portion 72 of the GND pads to form an S-shape on the surface of a dielectric substrate 12, while the signal line 14 crossing this extended portion 72 has an air bridge 14c formed at a portion thereof and straddles the extended portion 72 at this air bridge 14c.

In the RF measurement calibration pattern 70, in addition to the effect of the RF measurement calibration pattern 10 of Embodiment 1, the via holes 20 and the backside metal layer 22 in the RF measurement calibration pattern 10 or the backside metal layer 64 extending to the surface of the dielectric substrate 12 via the side surfaces thereof in the RF measurement calibration pattern 62 of Modification 2 becomes unnecessary so that the production of the RF measurement calibration pattern is facilitated. There may be a case where the characteristic impedance of the air bridge 14c of the signal line 14 differs from that of a portion other than the air bridge 14c of the signal line 14 and, in this case, it may be necessary to determine a width of the air bridge 14c so that the impedance of the air bridge 14c matches that of the portion other than the air bridge 14c.

Modification 5

Figure 19:
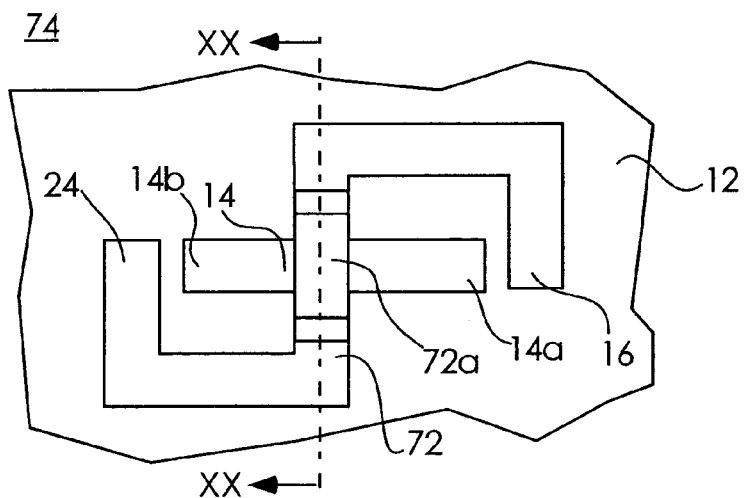
FIG. 19 is a plan view of an RF measurement calibration pattern according to one embodiment of the present invention.
Figure 20:
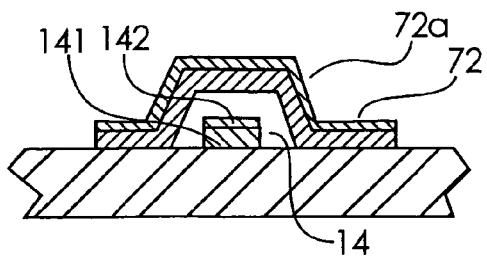
FIG. 20 is a sectional view of the RF measurement calibration pattern taken along a line XX—XX in FIG. 19.

FIG. 19 is a plan view of an RF measurement calibration pattern according to one embodiment of the present invention. FIG. 20 is a sectional view of the RF measurement calibration pattern taken along a line XX—XX in FIG. 19.

In the RF measurement calibration pattern 74 shown in FIGS. 19 and 20, end portions, each on the side not adjacent to a signal line 14, of a first GND pad 16 and a second GND pad 24 are connected together via an extended portion 72 to form an S-shape on the surface of a dielectric substrate 12, while this extended portion 72 has an air bridge 72a formed at a portion thereof and straddles the signal line 14 at this air bridge 72a.

The RF measurement calibration pattern 74 thus structured exhibits an effect like that of the RF measurement calibration pattern 70 of Modification 4.

There may be a case where the characteristic impedance of the air bridge 72a, under which the signal line 14 is located, of the extended portion 72 does not match that of the other portion and, in this case, it may be necessary to change a width of the line in consideration thereof.

Modification 6

Figure 21:
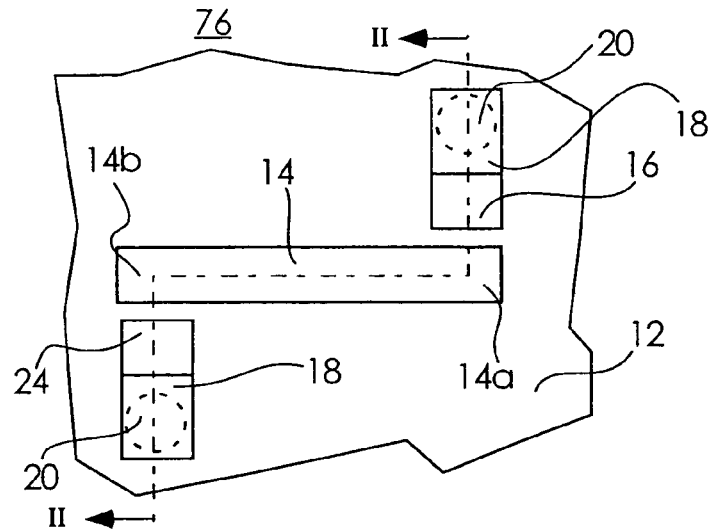
FIG. 21 is a plan view of an RF measurement calibration pattern according to one embodiment of the present invention.

FIG. 21 is a plan view of an RF measurement calibration pattern according to one embodiment of the present invention.

In the RF measurement calibration pattern 76 shown in FIG. 21, a first GND pad 16 is disposed with a predetermined interval defined between itself and a first end portion 14a of a signal line 14. What differs from the RF measurement calibration pattern 10 resides in that the first GND pad 16 in this modification has a front end portion disposed along the signal line 14 so as to confront the signal line 14. The first GND pad 16 is electrically separated from the signal line 14. The other end portion of the first GND pad 16 extends in a direction away from the signal line 14 and is connected to a through-hole electrode 18.

Further, a second GND pad 24 is disposed with the predetermined interval defined between itself and a second end portion 14b of the signal line 14. The second GND pad 24 also has a front end portion disposed along the signal line 14 so as to confront the signal line 14 and is electrically separated from the signal line 14. The other end portion of the second GND pad 24 extends in a direction away from the signal line 14 and is connected to a through-hole electrode 18.

The first GND pad 16 and the second GND pad 24 are not located exactly face to face, but are disposed so as to confront each other via the signal line 14 interposed therebetween.

The first GND pad 16 and the second GND pad 24 are electrically connected together via the through-hole electrodes 18, via holes 20, and a backside metal layer 22.

A sectional view, taken along a line II—II in FIG. 21, of the RF measurement calibration pattern 76 corresponds to FIG. 2.

Further, like the RF measurement calibration pattern 58 of Modification 1, the RF measurement calibration pattern 76 may further have a dielectric layer 60 disposed to cover the backside metal layer 22.

Figure 22:
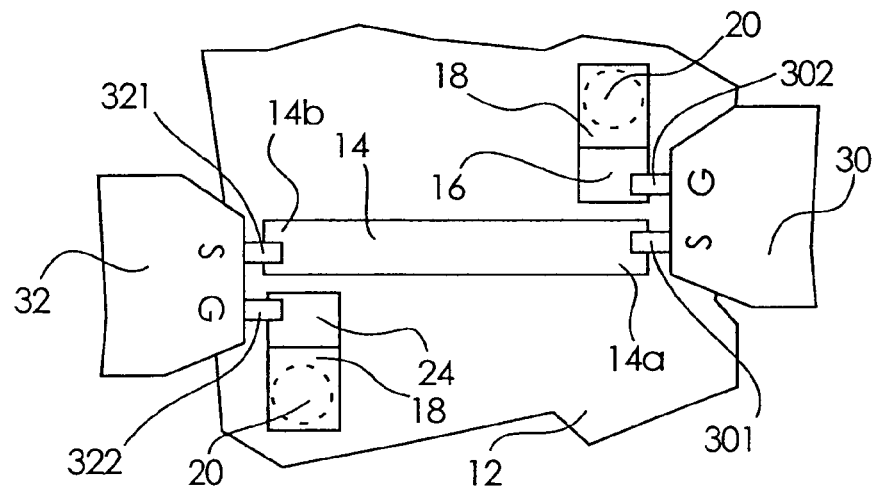
FIG. 22 is an exemplary diagram showing the state where RF measurement probe heads are in contact with the RF measurement calibration pattern according to Modification 6 of the present invention.

FIG. 22 is an exemplary diagram showing the state where RF measurement probe heads are in contact with the RF measurement calibration pattern according to Modification 6 of the present invention.

In FIG. 22, like in case of the RF measurement calibration pattern 10, an RF measurement probe head 30 and an RF measurement probe head 32 are disposed so as to confront each other. These two RF measurement probe heads 30 and 32 are both, for example, SG-type RF measurement probe heads.

When the calibration is carried out using the RF measurement calibration pattern 76, either of a signal terminal 301 of the RF measurement probe head 30 and a signal terminal 321 of the RF measurement probe head 32 does not lie across the GND line. Therefore, an RF signal does not affect a measurement value so that there is no occurrence of the measurement value being largely biased following an increase in signal frequency. Consequently, it is possible to implement the calibration of the RF measurement probe head 30 and the RF measurement probe head 32 with high accuracy.

Further, since the signal terminal 301 of the RF measurement probe head 30 and the signal terminal 321 of the RF measurement probe head 32 confront each other with a distance defined therebetween in a longitudinal direction of the signal line 14 and are located close to each other in a lateral direction, the crosstalk is reduced so that the calibration can be carried out with high accuracy.

Modification 7

Figure 23:
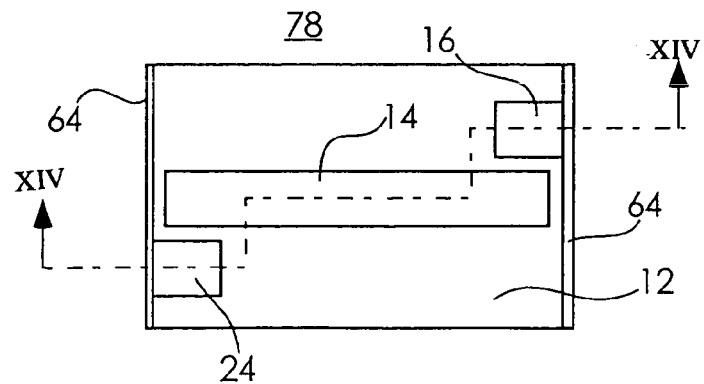
FIG. 23, FIG. 24, and FIG. 25 are plan views of an RF measurement calibration pattern according to one embodiment of the present invention.

FIG. 23 is a plan view of an RF measurement calibration pattern according to one embodiment of the present invention.

The RF measurement calibration pattern 78 shown in FIG. 23 has basically the same structure as the RF measurement calibration pattern 62 of Modification 2 shown in FIGS. 13 and 14. What differs from the RF measurement calibration pattern 62 resides in that while the first GND pad 16 and the second GND pad 24 of the RF measurement calibration pattern 62 each have a front end portion located on a prolongation of the signal line 14 in its longitudinal direction, a first GND pad 16 and a second GND pad 24 of the RF measurement calibration pattern 78 each have a front end portion disposed along a signal line 14 and a backside metal layer 64 is in contact with side surfaces of the first GND pad 16 and the second GND pad 24, respectively.

The other structure of the RF measurement calibration pattern 78 is the same as that of the RF measurement calibration pattern 62. A sectional view, taken along a line XIV—XIV in FIG. 23, of the RF measurement calibration pattern 78 corresponds to FIG. 14.

Therefore, in the RF measurement calibration pattern 78, in addition to the effect of the RF measurement calibration pattern 62, since the signal terminal 301 of the RF measurement probe head 30 and the signal terminal 321 of the RF measurement probe head 32 confront each other with a distance defined therebetween in a longitudinal direction of the signal line 14 and are located close to each other in a lateral direction, the crosstalk is reduced so that the calibration can be carried out with high accuracy.

Modification 8

Figure 24:
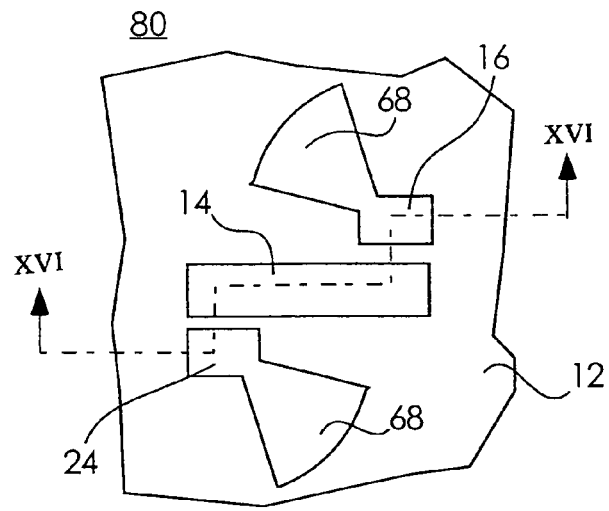

FIG. 24 is a plan view of an RF measurement calibration pattern according to one embodiment of the present invention.

The RF measurement calibration pattern 80 shown in FIG. 24 has basically the same structure as the RF measurement calibration pattern 66 of Modification 3 shown in FIGS. 15 and 16. What differs from the RF measurement calibration pattern 66 resides in that while the first GND pad 16 and the second GND pad 24 of the RF measurement calibration pattern 66 each have a front end portion located on a prolongation of the signal line 14 in its longitudinal direction, a first GND pad 16 and a second GND pad 24 of the RF measurement calibration pattern 80 each have a front end portion disposed along a signal line 14.

The other structure of the RF measurement calibration pattern 80 is the same as that of the RF measurement calibration pattern 66. A sectional view, taken along a line XVI—XVI in FIG. 24, of the RF measurement calibration pattern 80 corresponds to FIG. 16.

Therefore, in the RF measurement calibration pattern 80, in addition to the effect of the RF measurement calibration pattern 66, since the signal terminal 301 of the RF measurement probe head 30 and the signal terminal 321 of the RF measurement probe head 32 confront each other with a distance defined therebetween in a longitudinal direction of the signal line 14 and are located close to each other in a lateral direction, the crosstalk is reduced so that the calibration can be carried out with high accuracy.

Modification 9

Figure 25:
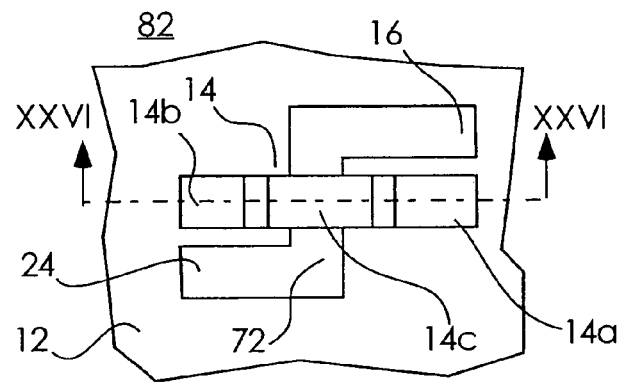
Figure 26:
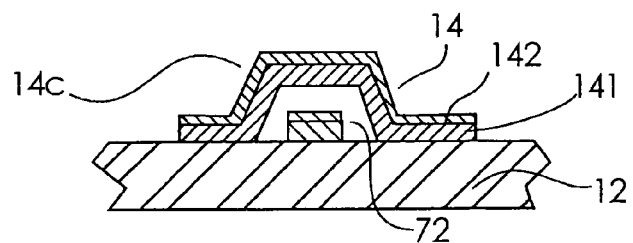
FIG. 26 is a sectional view of the RF measurement calibration pattern taken along a line XXVI—XXVI in FIG. 25.

FIG. 25 is a plan view of an RF measurement calibration pattern according to one embodiment of the present invention. FIG. 26 is a sectional view of the RF measurement calibration pattern taken along a line XXVI—XXVI in FIG. 25.

The RF measurement calibration pattern 82 shown in FIG. 25 has basically the same structure as the RF measurement calibration pattern 70 of Modification 4 shown in FIG. 17. What differs from the RF measurement calibration pattern 70 resides in that while the first GND pad 16 and the second GND pad 24 of the RF measurement calibration pattern 70 each have a front end portion located on a prolongation of the signal line 14 in its longitudinal direction, a first GND pad 16 and a second GND pad 24 of the RF measurement calibration pattern 82 are disposed along a signal line 14 and each have a front end portion disposed side by side with a first end portion 14a or a second end portion 14b of the signal line 14.

The other structure of the RF measurement calibration pattern 82 is the same as that of the RF measurement calibration pattern 70.

Therefore, in the RF measurement calibration pattern 82, in addition to the effect of the RF measurement calibration pattern 70, since the signal terminal 301 of the RF measurement probe head 30 and the signal terminal 321 of the RF measurement probe head 32 confront each other with a distance defined therebetween in a longitudinal direction of the signal line 14 and are located close to each other in a lateral direction, the crosstalk is reduced so that the calibration can be carried out with high accuracy.

Modification 10

Figure 27:
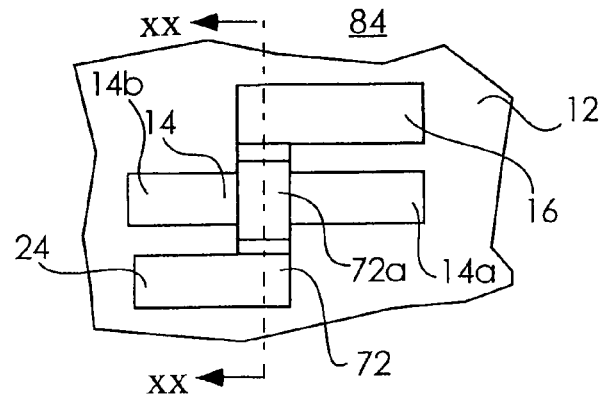
FIG. 27, FIG. 28, FIG. 29, FIG. 30, FIG. 31, FIG. 32, FIG. 33, FIG. 34, FIG. 35, FIG. 36, and FIG. 37 are plan views of an RF measurement calibration pattern according to one embodiment of the present invention.

FIG. 27 is a plan view of an RF measurement calibration pattern according to one embodiment of the present invention.

The RF measurement calibration pattern 84 shown in FIG. 27 has basically the same structure as the RF measurement calibration pattern 74 of Modification 5 shown in FIGS. 19 and 20. What differs from the RF measurement calibration pattern 74 resides in that while the first GND pad 16 and the second GND pad 24 of the RF measurement calibration pattern 74 each have a front end portion located on a prolongation of the signal line 14 in its longitudinal direction, a first GND pad 16 and a second GND pad 24 of the RF measurement calibration pattern 84 are disposed along a signal line 14 and each have a front end portion disposed side by side with a first end portion 14a or a second end portion 14b of the signal line 14.

The other structure of the RF measurement calibration pattern 84 is the same as that of the RF measurement calibration pattern 74.

A sectional view, taken along a line XX—XX in FIG. 27, of the RF measurement calibration pattern 84 corresponds to FIG. 20.

Therefore, in the RF measurement calibration pattern 84, in addition to the effect of the RF measurement calibration pattern 74, since the signal terminal 301 of the RF measurement probe head 30 and the signal terminal 321 of the RF measurement probe head 32 confront each other with a distance defined therebetween in a longitudinal direction of the signal line 14 and are located close to each other in a lateral direction, the crosstalk is reduced so that the calibration can be carried out with high accuracy.

As described above, the RF measurement calibration pattern according to Embodiment 1 comprises the dielectric substrate, the signal line having one characteristic impedance of, for example, 50Ω and extending to have the first and second end portions on the dielectric substrate, the first GND pad having one end portion disposed close to and with a predetermined interval from the first end portion of the signal line, the second GND pad having one end portion disposed close to and with a predetermined interval from the second end portion of the signal line, and the through-hole electrodes, the via holes, and the backside metal layer for electrically connecting between the first GND pad and the second GND pad, or the backside metal layer extending to the surface of the dielectric substrate via the side surfaces thereof for electrically connecting between the first GND pad and the second GND pad, or the open stubs for connecting between the first GND pad and the second GND pad in a high-frequency manner. With this structure, even when the SG-type RF measurement probe heads or the GS-type RF measurement probe heads are used so as to confront each other with their signal terminals being brought into contact with the signal line of the calibration pattern, either of the signal terminals of the RF measurement probe heads does not lie across the GND line. Therefore, the RF signal does not affect the measurement value so that there is no occurrence of the measurement value being largely biased following an increase in signal frequency. Consequently, it is possible to implement the calibration of the RF measurement probe heads with high accuracy.

Further, in the high frequency circuit property measurement method for carrying out the calibration by the use of the RF measurement calibration pattern according to Embodiment 1, since the RF signal has no effect on either of the signal terminals of the first and second property measurement probe heads, the accurate calibration can be achieved so that the property measurement of the high frequency circuit is precisely carried out. Consequently, selection of high frequency circuits can be accurately performed to thereby improve the yield of high frequency circuit devices.

The foregoing description has been given about the case where the SG-type RF measurement probe heads are used. However, if the first GND pad and the second GND pad are arranged so as to be in a reflected image relation with respect to the center axis of the signal line, the present invention is also applicable to a case where the GS-type RF measurement probe heads are used.

Embodiment 2

Figure 28:
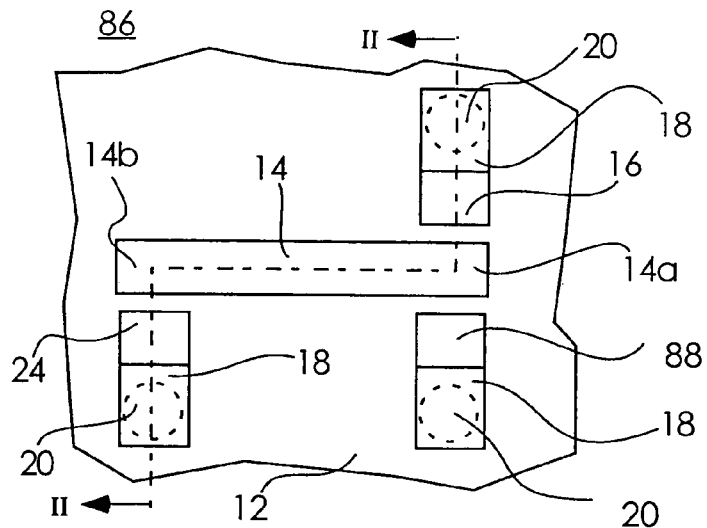

FIG. 28 is a plan view of an RF measurement calibration pattern according to one embodiment of the present invention.

The RF measurement calibration pattern 86 shown in FIG. 28 has basically the same structure as the RF measurement calibration pattern 76 of Modification 6 of Embodiment 1 shown in FIG. 21. What differs from the RF measurement calibration pattern 76 resides in that there is further disposed a third GND pad 88 serving as a third constant potential line that confronts face to face the first GND pad 16 of the RF measurement calibration pattern 76 via the signal line 14 at the first end portion 14*a* thereof and is electrically separated from the signal line 14.

The third GND pad 88 has a front end portion disposed along the signal line 14 and confronting face to face a front end portion of the first GND pad 16 via the signal line 14. The other end portion of the third GND pad 88 extends in a direction away from the signal line 14 and is connected to a through-hole electrode 18.

The third GND pad 88 is electrically connected to the backside metal layer 22 via the through-hole electrode 18 and a via hole 20. Therefore, the third GND pad 88 is electrically connected to the first GND pad 16 and the second GND pad 24.

The structure of the third GND pad 88 is the same as that of the first GND pad 16, wherein a gold-plating layer is disposed on the surface of a metal layer. In this embodiment, the through-hole electrode 18 connected to the third GND pad 88 is formed by the metal layer part of which also forms the third GND pad 88.

A sectional view taken along a line II—II in FIG. 28 corresponds to FIG. 2.

In the RF measurement calibration pattern 86 according to Embodiment 2, an SG-type RF measurement probe head is put in contact at the second end portion 14*b* of the signal line 14 while an SG-type, GS-type or GSG-type RF measurement probe head is contactable at the first end portion 14*a* of the signal line 14.

When performing calibration for property measurement of a high frequency circuit by the use of the SG-type RF measurement probe heads, by the use of the GS-type RF measurement probe heads wherein the second GND pad 24 is arranged so as to be in a reflected image relation with respect to the center axis of the signal line from the current state, or by the use of the SG-type RF measurement probe head and the GS-type or GSG-type RF measurement probe head confronting thereto, if the calibration is carried out using the RF measurement calibration pattern 86, either of the signal terminals does not lie across the GND line as described in Embodiment 1. Therefore, an RF signal does not affect the measurement value so that there is no occurrence of the measurement value being largely biased following an increase in signal frequency. Consequently, it is possible to implement the calibration of the RF measurement probe heads with high accuracy.

Modification 11

Figure 29:
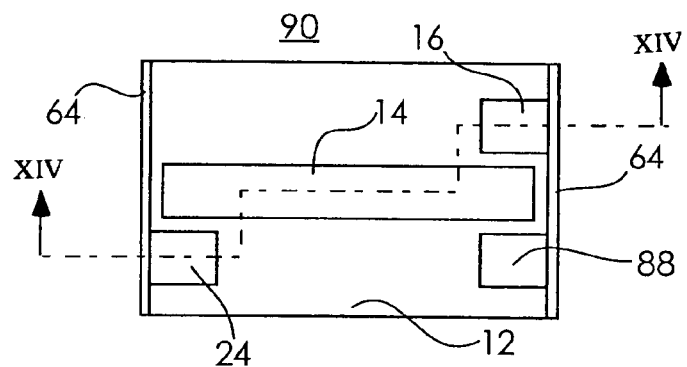

FIG. 29 is a plan view of an RF measurement calibration pattern according to one embodiment of the present invention.

The RF measurement calibration pattern 90 shown in FIG. 29 is a modification of Embodiment 2, but has basically the same structure as the RF measurement calibration pattern 78 of Modification 7 of Embodiment 1 shown in FIG. 23. What differs from the RF measurement calibration pattern 78 resides in that there is further disposed a third GND pad 88 that confronts the first GND pad 16 of the RF measurement calibration pattern 78 via the signal line 14 and is electrically separated from the signal line 14. The third GND pad 88 has a front end portion disposed along the signal line 14 and has a side surface contacting the backside metal layer 64 like the first GND pad 16. Therefore, the first GND pad 16, the second GND pad 24, and the third GND pad 88 are electrically connected together.

A sectional view taken along a line XIV—XIV in FIG. 29 corresponds to FIG. 14.

Therefore, the RF measurement calibration pattern 90 is applicable when performing calibration for property measurement of a high frequency circuit by the use of the SG-type RF measurement probe heads, by the use of the GS-type RF measurement probe heads wherein the second GND pad 24 is arranged so as to be in a reflected image relation with respect to the center axis of the signal line from the current state, or by the use of the SG-type RF measurement probe head and the GS-type or GSG-type RF measurement probe head confronting thereto, and exhibits an effect like that of Modification 7 of Embodiment 1.

Modification 12

Figure 30:
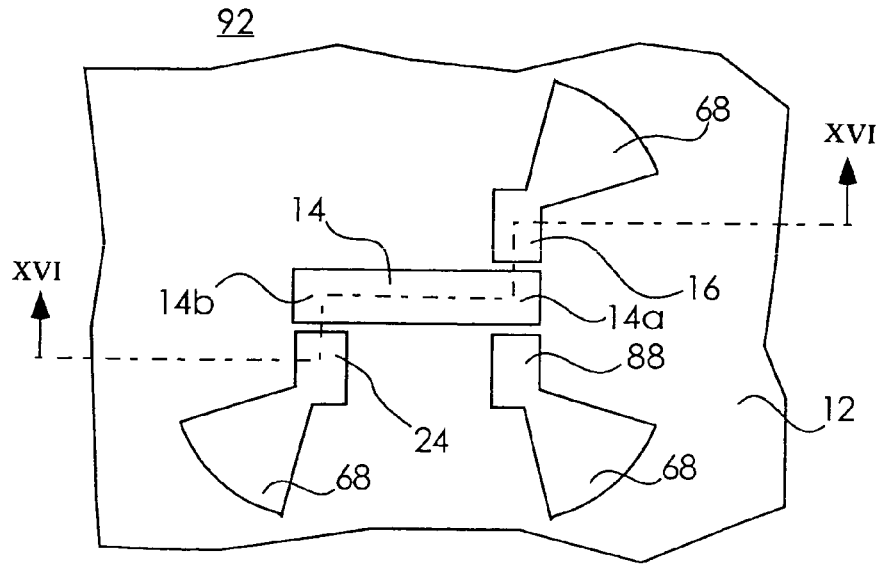

FIG. 30 is a plan view of an RF measurement calibration pattern according to one embodiment of the present invention.

The RF measurement calibration pattern 92 shown in FIG. 30 is a modification of Embodiment 2, but has basically the same structure as the RF measurement calibration pattern 80 of Modification 8 of Embodiment 1 shown in FIG. 24. What differs from the RF measurement calibration pattern 80 resides in that there is further disposed a third GND pad 88 that confronts the first GND pad 16 of the RF measurement calibration pattern 80 via the signal line 14 and is electrically separated from the signal line 14. The third GND pad 88 has a front end portion disposed along the signal line 14 and an open stub 68 is connected to an end portion, on the side not adjacent to the signal line 14, of the third GND pad 88.

By setting a size of the open stub 68 to a quarter of a wavelength of frequency of a signal to be measured, the first GND pad 16, the second GND pad 24, and the third GND pad 88 are connected together via the open stubs 68 in a high-frequency manner.

A sectional view taken along a line XVI—XVI in FIG. 30 corresponds to FIG. 16.

Therefore, the RF measurement calibration pattern 92 is applicable when performing calibration for property measurement of a high frequency circuit by the use of the SG-type RF measurement probe heads, by the use of the GS-type RF measurement probe heads wherein the second GND pad 24 is arranged so as to be in a reflected image relation with respect to the center axis of the signal line from the current state, or by the use of the SG-type RF measurement probe head and the GS-type or GSG-type RF measurement probe head confronting thereto, and exhibits an effect like that of Modification 8 of Embodiment 1.

Modification 13

Figure 31:
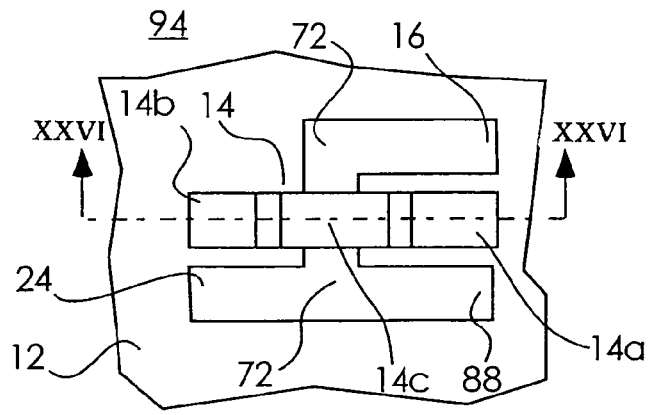

FIG. 31 is a plan view of an RF measurement calibration pattern according to one embodiment of the present invention.

The RF measurement calibration pattern 94 shown in FIG. 31 is a modification of Embodiment 2, but has basically the same structure as the RF measurement calibration pattern 82 of Modification 9 of Embodiment 1 shown in FIGS. 25 and 26. What differs from the RF measurement calibration pattern 82 resides in that there is further disposed a third GND pad 88 that confronts the first GND pad 16 of the RF measurement calibration pattern 82 via the signal line 14 and is electrically separated from the signal line 14. The third GND pad 88 is disposed along the signal line 14 and has a front end portion disposed side by side with the first end portion 14a of the signal line 14. The third GND pad 88 is connected to the first GND pad 16 and the second GND pad 24 via the extended portion 72 on the surface of the dielectric substrate.

A sectional view taken along a line XXVI—XXVI in FIG. 31 corresponds to FIG. 26.

Therefore, the RF measurement calibration pattern 94 is applicable when performing calibration for property measurement of a high frequency circuit by the use of the SG-type RF measurement probe heads, by the use of the GS-type RF measurement probe heads wherein the second GND pad 24 is arranged so as to be in a reflected image relation with respect to the center axis of the signal line from the current state, or by the use of the SG-type RF measurement probe head and the GS-type or GSG-type RF measurement probe head confronting thereto, and exhibits an effect like that of Modification 9 of Embodiment 1.

Modification 14

Figure 32:
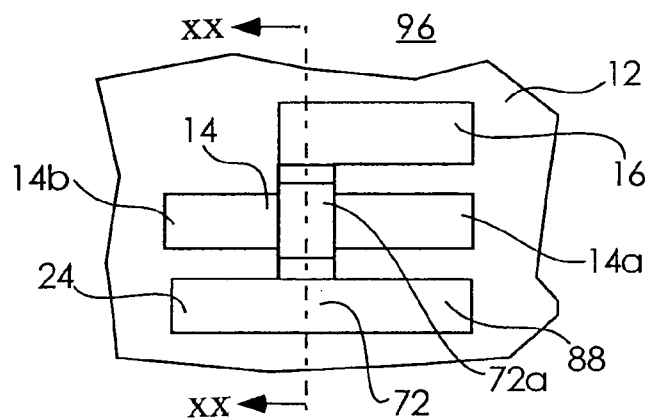

FIG. 32 is a plan view of an RF measurement calibration pattern according to one embodiment of the present invention.

The RF measurement calibration pattern 96 shown in FIG. 32 is a modification of Embodiment 2, but has basically the same structure as the RF measurement calibration pattern 84 of Modification 10 of Embodiment 1 shown in FIG. 27. What differs from the RF measurement calibration pattern 84 resides in that there is further disposed a third GND pad 88 that confronts the first GND pad 16 of the RF measurement calibration pattern 84 via the signal line 14 and is electrically separated from the signal line 14. The third GND pad 88 is disposed along the signal line 14 and has a front end portion disposed side by side with the first end portion 14a of the signal line 14. The third GND pad 88 is connected to the first GND pad 16 and the second GND pad 24 via the extended portion 72 on the surface of the dielectric substrate.

A sectional view taken along a line XX—XX in FIG. 32 corresponds to FIG. 20.

Therefore, the RF measurement calibration pattern 96 is applicable when performing calibration for property measurement of a high frequency circuit by the use of the SG-type RF measurement probe heads, by the use of the GS-type RF measurement probe heads wherein the second GND pad 24 is arranged so as to be in a reflected image relation with respect to the center axis of the signal line from the current state, or by the use of the SG-type RF measurement probe head and the GS-type or GSG-type RF measurement probe head confronting thereto, and exhibits an effect like that of Modification 10 of Embodiment 1.

As described above, the RF measurement calibration pattern according to Embodiment 2 comprises the dielectric substrate, the signal line having one characteristic impedance of, for example, 50Ω and extending to have the first and second end portions on the dielectric substrate, the first GND pad having one end portion disposed close to and with a predetermined interval from the first end portion of the signal line, the second GND pad having one end portion disposed close to and with a predetermined interval from the second end portion of the signal line, the third GND pad confronting face to face the first GND pad via the signal line, and the through-hole electrodes, the via holes, and the backside metal layer for electrically connecting together the first GND pad, the second GND pad, and the third GND pad, or the backside metal layer extending to the surface of the dielectric substrate via the side surfaces thereof for electrically connecting together the first GND pad, the second GND pad, and the third GND pad, or the open stubs for connecting together the first GND pad, the second GND pad, and the third GND pad in a high-frequency manner. With this structure, even when the SG-type RF measurement probe heads, the GS-type RF measurement probe heads, or the SG-type RF measurement probe head and the GS-type or GSG-type RF measurement probe head are used so as to confront each other with their signal terminals being brought into contact with the signal line of the calibration pattern, either of the signal terminals of the RF measurement probe heads does not lie across the GND line. Therefore, the RF signal does not affect the measurement value so that there is no occurrence of the measurement value being largely biased following an increase in signal frequency. Consequently, it is possible to implement the calibration of the RF measurement probe heads with high accuracy.

Further, in the high frequency circuit property measurement method for carrying out the calibration by the use of the RF measurement calibration pattern according to Embodiment 2, since the RF signal has no effect on either of the signal terminals of the first and second property measurement probe heads, the accurate calibration can be achieved so that the property measurement of the high frequency circuit is precisely carried out. Consequently, selection of high frequency circuits can be accurately performed to thereby improve the yield of high frequency circuit devices.

Embodiment 3

Figure 33:
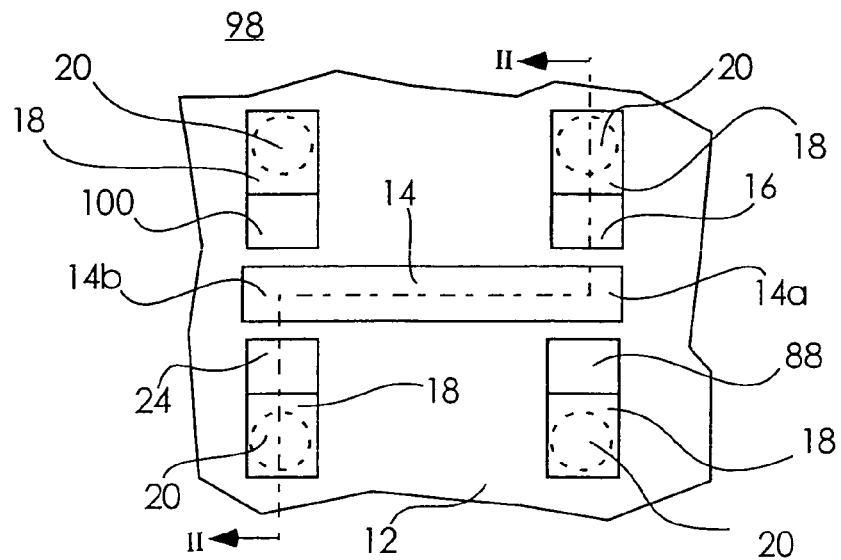

FIG. 33 is a plan view of an RF measurement calibration pattern according to one embodiment of the present invention.

The RF measurement calibration pattern 98 shown in FIG. 33 is formed by further disposing, on the RF measurement calibration pattern 86 of Embodiment 2, a fourth GND pad 100 serving as a fourth constant potential line that confronts the second GND pad 24 via the signal line 14 and is electrically separated from the signal line 14.

The fourth GND pad 100 has a front end portion disposed along the signal line 14 at the second end portion 14b thereof and confronting face to face a front end portion of the second GND pad 24 via the signal line 14. The other end portion of the fourth GND pad 100 extends in a direction away from the signal line 14 and is connected to a through-hole electrode 18.

The fourth GND pad 100 is electrically connected to the backside metal layer 22 via the through-hole electrode 18 and a via hole 20. Therefore, the fourth GND pad 100 is electrically connected to the first GND pad 16, the second GND pad 24, and the third GND pad 88.

The structure of the fourth GND pad 100 is the same as that of the first GND pad 16, wherein a gold-plating layer is disposed on the surface of a metal layer. In this embodiment, the through-hole electrode 18 connected to the fourth GND pad 100 is formed by the metal layer part of which also forms the fourth GND pad 100.

A sectional view taken along a line II—II in FIG. 33 corresponds to FIG. 2.

In the RF measurement calibration pattern 98 according to Embodiment 3, the RF measurement probe head of any type, i.e. any of the SG-type RF measurement probe head, the GS-type RF measurement probe head, and the GSG-type RF measurement probe head, is usable or contactable at each of the first end portion 14a and the second end portion 14b of the signal line 14.

When performing calibration for property measurement of a high frequency circuit by the use of any type or types of the RF measurement probe heads, the calibration can be carried out using the RF measurement calibration pattern 100. When the calibration is implemented using the RF measurement calibration pattern 100, either of the signal terminals of the RF measurement probe heads of any type or types does not lie across the GND line of the RF measurement calibration pattern 100 as described in Embodiment 1. Therefore, an RF signal does not affect a measurement value so that there is no occurrence of the measurement value being largely biased following an increase in signal frequency. Consequently, it is possible to implement the calibration of the RF measurement probe heads with high accuracy.

Modification 15

Figure 34:
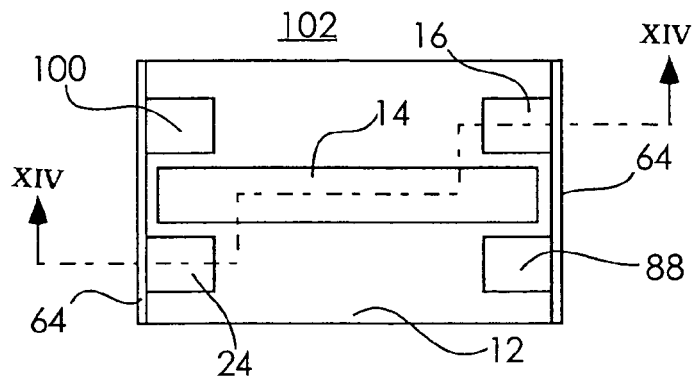

FIG. 34 is a plan view of an RF measurement calibration pattern according to one embodiment of the present invention.

The RF measurement calibration pattern 102 shown in FIG. 34 is a modification of Embodiment 3, but is formed by further disposing, on the RF measurement calibration pattern 90 of Modification 11 of Embodiment 2 shown in FIG. 29, a fourth GND pad 100 that confronts the second GND pad 24 via the signal line 14 and is electrically separated from the signal line 14. The fourth GND pad 100 has a front end portion disposed along the signal line 14 and has a side surface contacting the backside metal layer 64 like the first GND pad 16. Therefore, the first GND pad 16, the second GND pad 24, the third GND pad 88, and the fourth GND pad 100 are electrically connected together.

A sectional view taken along a line XIV—XIV in FIG. 34 corresponds to FIG. 14.

In the RF measurement calibration pattern 102 according to Modification 15, the RF measurement probe head of any type, i.e. any of the SG-type RF measurement probe head, the GS-type RF measurement probe head, and the GSG-type RF measurement probe head, is usable or contactable at each of the first end portion 14a and the second end portion 14b of the signal line 14.

When performing calibration for property measurement of a high frequency circuit by the use of any type or types of the RF measurement probe heads, the RF measurement calibration pattern 102 enables the calibration of the RF measurement probe heads and exhibits an effect like that of Modification 11 of Embodiment 2.

Modification 16

Figure 35:
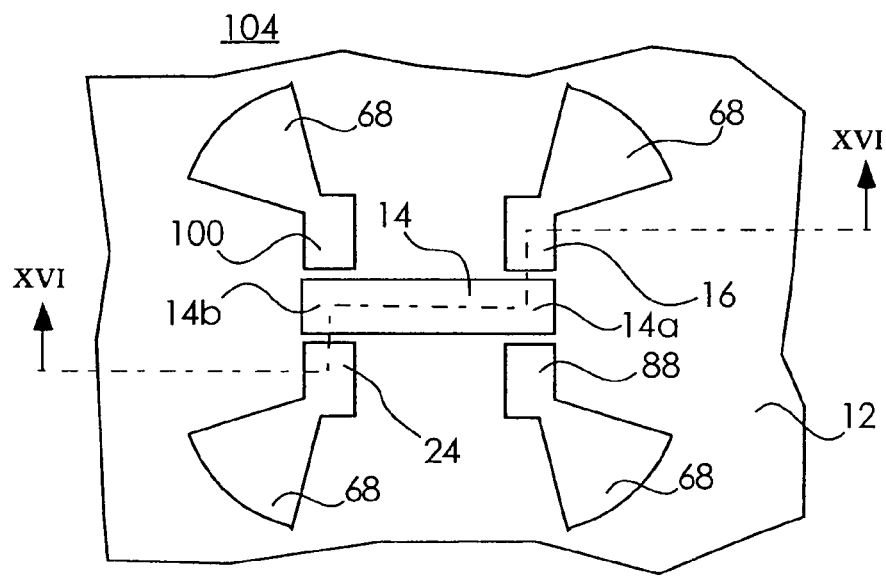

FIG. 35 is a plan view of an RF measurement calibration pattern according to one embodiment of the present invention.

The RF measurement calibration pattern 104 shown in FIG. 35 is a modification of Embodiment 3, but is formed by further disposing, on the RF measurement calibration pattern 92 of Modification 12 of Embodiment 2 shown in FIG. 30, a fourth GND pad 100 that confronts the second GND pad 24 via the signal line 14 and is electrically separated from the signal line 14. The fourth GND pad 100 has a front end portion disposed along the signal line 14 and an open stub 68 is connected to an end portion, on the side not adjacent to the signal line 14, of the fourth GND pad 100. Therefore, the first GND pad 16, the second GND pad 24, the third GND pad 88, and the fourth GND pad 100 are connected together in a high-frequency manner.

A sectional view taken along a line XVI—XVI in FIG. 35 corresponds to FIG. 16.

In the RF measurement calibration pattern 104 according to Modification 16, the RF measurement probe head of any type, i.e. any of the SG-type RF measurement probe head, the GS-type RF measurement probe head, and the GSG-type RF measurement probe head, is usable or contactable at each of the first end portion 14a and the second end portion 14b of the signal line 14.

When performing calibration for property measurement of a high frequency circuit by the use of any type or types of the RF measurement probe heads, the RF measurement calibration pattern 104 enables the calibration of the RF measurement probe heads and exhibits an effect like that of Modification 12 of Embodiment 2.

Modification 17

Figure 36:
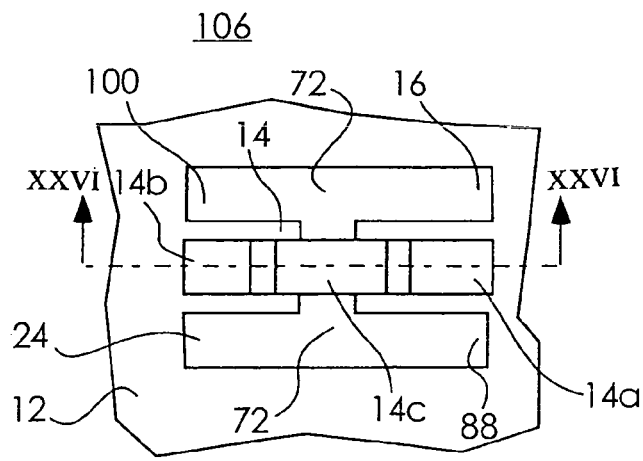

FIG. 36 is a plan view of an RF measurement calibration pattern according to one embodiment of the present invention.

The RF measurement calibration pattern 106 shown in FIG. 36 is a modification of Embodiment 3, but is formed by further disposing, on the RF measurement calibration pattern 94 of Modification 13 of Embodiment 2 shown in FIG. 31, a fourth GND pad 100 that confronts the second GND pad 24 via the signal line 14 and is electrically separated from the signal line 14. The fourth GND pad 100 is disposed along the signal line 14 and has a front end portion disposed side by side with the second end portion 14b of the signal line 14. The fourth GND pad 100 is connected to the first GND pad 16, the second GND pad 24, and the third GND pad 88 via the extended portion 72 of the GND pads on the surface of the dielectric substrate.

A sectional view taken along a line XXVI—XXVI in FIG. 36 corresponds to FIG. 26.

In the RF measurement calibration pattern 106 according to Modification 17, the RF measurement probe head of any type, i.e. any of the SG-type RF measurement probe head, the GS-type RF measurement probe head, and the GSG-type RF measurement probe head, is usable or contactable at each of the first end portion 14a and the second end portion 14b of the signal line 14.

When performing calibration for property measurement of a high frequency circuit by the use of any type or types of the RF measurement probe heads, the RF measurement calibration pattern 106 enables the calibration of the RF measurement probe heads and exhibits an effect like that of Modification 13 of Embodiment 2.

Modification 18

Figure 37:
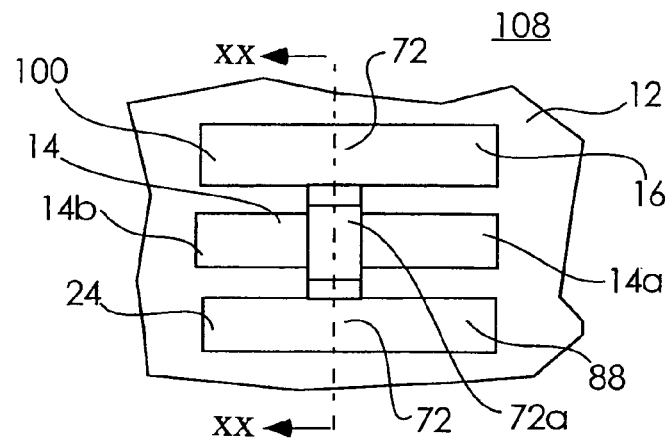

FIG. 37 is a plan view of an RF measurement calibration pattern according to one embodiment of the present invention.

The RF measurement calibration pattern 108 shown in FIG. 37 is a modification of Embodiment 3, but is formed by further disposing, on the RF measurement calibration pattern 96 of Modification 14 of Embodiment 2 shown in FIG. 32, a fourth GND pad 100 that confronts the second GND pad 24 via the signal line 14 and is electrically separated from the signal line 14. The fourth GND pad 100 is disposed along the signal line 14 and has a front end portion disposed side by side with the second end portion 14b of the signal line 14. The fourth GND pad 100 is connected to the first GND pad 16, the second GND pad 24, and the third GND pad 88 via the extended portion 72 of the GND pads on the surface of the dielectric substrate.

A sectional view taken along a line XX—XX in FIG. 37 corresponds to FIG. 20.

In the RF measurement calibration pattern 108 according to Modification 18, the RF measurement probe head of any type, i.e. any of the SG-type RF measurement probe head, the GS-type RF measurement probe head, and the GSG-type RF measurement probe head, is usable or contactable at each of the first end portion 14a and the second end portion 14b of the signal line 14.

When performing calibration for property measurement of a high frequency circuit by the use of any type or types of the RF measurement probe heads, the RF measurement calibration pattern 108 enables the calibration of the RF measurement probe heads and exhibits an effect like that of Modification 14 of Embodiment 2.

As described above, the RF measurement calibration pattern according to Embodiment 3 comprises the dielectric substrate, the signal line having one characteristic impedance of, for example, 50Ω and extending to have the first and second end portions on the dielectric substrate, the first GND pad having one end portion disposed close to and with a predetermined interval from the first end portion of the signal line, the second GND pad having one end portion disposed close to and with a predetermined interval from the second end portion of the signal line, the third GND pad confronting face to face the first GND pad via the signal line, the fourth GND pad confronting face to face the second GND pad via the signal line, and the through-hole electrodes, the via holes, and the backside metal layer for electrically connecting together the first GND pad, the second GND pad, the third GND pad, and the fourth GND pad, or the backside metal layer extending to the surface of the dielectric substrate via the side surfaces thereof for electrically connecting together the first GND pad, the second GND pad, the third GND pad, and the fourth GND pad, or the open stubs for connecting together the first GND pad, the second GND pad, the third GND pad, and the fourth GND pad in a high-frequency manner. With this structure, even when the RF measurement probe heads of any combination among the SG-type RF measurement probe head/heads, the GS-type RF measurement probe head/heads, and the GSG-type RF measurement probe head/heads are used so as to confront each other with their signal terminals being brought into contact with the signal line of the calibration pattern, either of the signal terminals of the RF measurement probe heads does not lie across the GND line. Therefore, the RF signal does not affect the measurement value so that there is no occurrence of the measurement value being largely biased following an increase in signal frequency. Consequently, it is possible to implement the calibration of the RF measurement probe heads with high accuracy.

Further, in the high frequency circuit property measurement method for carrying out the calibration by the use of the RF measurement calibration pattern according to Embodiment 3, since the RF signal has no effect on either of the signal terminals of the first and second property measurement probe heads of any combination, the accurate calibration can be achieved so that the property measurement of the high frequency circuit is precisely carried out. Consequently, selection of high frequency circuits can be accurately performed to thereby improve the yield of high frequency circuit devices.

Embodiment 4

Figure 38:
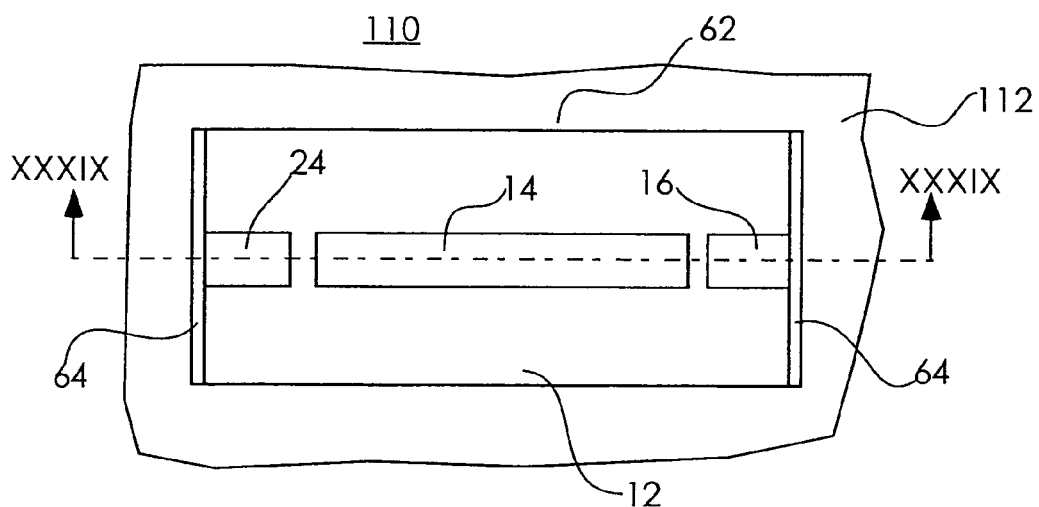
FIG. 38 is a plan view of an RF measurement calibration jig according to one embodiment of the present invention.
Figure 39:
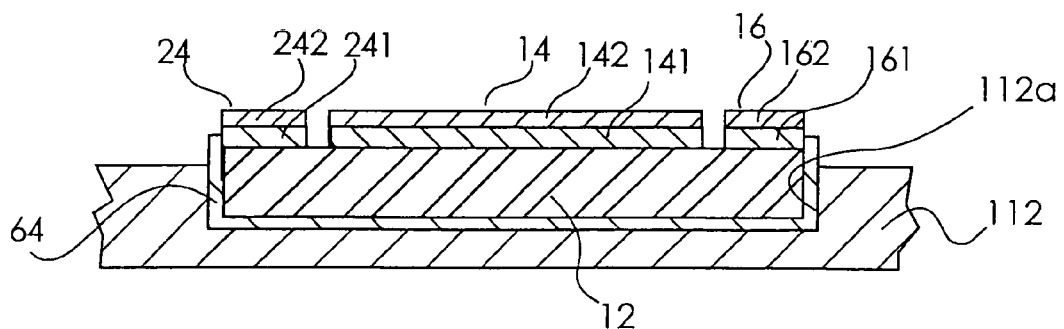
FIG. 39 is a sectional view of the RF measurement calibration jig taken along a line XXXIX—XXXIX in FIG. 38.

FIG. 38 is a plan view of an RF measurement calibration jig according to one embodiment of the present invention. FIG. 39 is a sectional view of the RF measurement calibration jig taken along a line XXXIX—XXXIX in FIG. 38.

In FIGS. 38 and 39, the RF measurement calibration jig 110 includes, as one example, the RF measurement calibration pattern 62 of Modification 2 of Embodiment 1 shown in FIGS. 13 and 14. Note that use can be made of any of the foregoing RF measurement calibration patterns of Embodiment 1, Embodiment 2, and Embodiment 3.

A dielectric substrate 112 of the RF measurement calibration jig 110 is formed with a recessed portion 112a for mounting therein the RF measurement calibration pattern 62. The recessed portion 112a is formed so as to exchangeably receive therein RF measurement calibration patterns, one at a time, having different lengths. Therefore, it is possible to carry out calibration at predetermined required frequencies with one jig.

As described above, the RF measurement calibration jig according to this embodiment makes it possible to carry out calibration at predetermined required frequencies by the use of one jig. Consequently, selection of high frequency circuits can be accurately and easily performed to thereby improve the yield of high frequency circuit devices with the simple process.

The foregoing description has been given about the RF measurement calibration pattern using the dielectric substrate. However, the effect can be similarly achieved even when a signal line and respective GND pads are formed on a wafer instead of the dielectric substrate.

As described above, the high frequency circuit property measurement method according to the present invention is suitable for an RF measurement method for a high frequency circuit for use in a communication device adapted for a microwave band or a millimeter wave band that is used in mobile communication, optical communication, satellite communication, and the like.

While the presently preferred embodiments of the present invention have been shown and described. It is to be understood these disclosures are for the purpose of illustration and that various changes and modifications may be made without departing from the scope of the invention as set forth in the appended claims.

What is claimed is:

1. A circuit property measurement method comprising:

preparing a calibration pattern comprising a substrate, a signal line having a characteristic impedance and first and second ends on said substrate, said signal line directly connecting the first end to the second end, a first constant potential line having a first end disposed close to and at a predetermined interval from the first end of said signal line, a second constant potential line having a first end disposed close to and at a predetermined interval from the second end of said signal line, and a conductor electrically coupling said first constant potential line to said second constant potential line; and calibrating first and second property measurement probe heads having identical electrical arrangements consisting of spaced apart signal and constant potential terminals arranged in the same order on both of said first and second property measurement probe heads, by bringing said signal terminal and said constant potential terminal of said first property measurement probe head into contact with the first end of said signal line and the first end of said first constant potential line of said calibration pattern, respectively, and by bringing said signal terminal and said constant potential terminal of said second property measurement probe head into contact with the second end of said signal line and the first end of said second constant potential line of said calibration pattern, respectively.

* * * * *